(12) United States Patent
Staben et al.

(10) Patent No.: US 7,233,492 B2
(45) Date of Patent: Jun. 19, 2007

(54) COOLING SYSTEMS AND METHODS FOR SAME

(75) Inventors: Paul Ross Staben, Houston, TX (US); Paul E. Westphall, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 45 days.

(21) Appl. No.: 10/830,930

(22) Filed: Apr. 22, 2004

(65) Prior Publication Data

US 2005/0237715 A1 Oct. 27, 2005

(51) Int. Cl.
*H05K 7/20* (2006.01)
*H01L 23/34* (2006.01)
*H05K 5/00* (2006.01)
*F28F 7/00* (2006.01)
*H02G 3/03* (2006.01)

(52) U.S. Cl. ............ 361/695; 361/699; 257/714; 454/184; 165/80.4; 174/15.1; 174/16.1; 312/236; 417/67; 417/118

(58) Field of Classification Search ......... 361/695, 361/698; 417/66, 67, 118
See application file for complete search history.

(56) References Cited

U.S. PATENT DOCUMENTS

| | | | | |
|---|---|---|---|---|
| 5,440,450 A | * | 8/1995 | Lau et al. ............. | 361/695 |
| 5,566,377 A | * | 10/1996 | Lee ..................... | 361/695 |
| 5,572,403 A | * | 11/1996 | Mills ................... | 361/695 |
| 6,208,512 B1 | * | 3/2001 | Goldowsky et al. .... | 361/699 |
| 6,327,145 B1 | * | 12/2001 | Lian et al. ............ | 361/697 |
| 6,408,937 B1 | * | 6/2002 | Roy .................. | 165/104.33 |
| 6,496,366 B1 | * | 12/2002 | Coglitore et al. ...... | 361/687 |
| 6,535,386 B2 | * | 3/2003 | Sathe et al. ........... | 361/700 |
| 6,628,520 B2 | | 9/2003 | Patel et al. | |
| 6,668,911 B2 | * | 12/2003 | Bingler ............... | 165/80.4 |
| 6,809,927 B2 | * | 10/2004 | Ohashi et al. ......... | 361/699 |
| 6,827,131 B1 | * | 12/2004 | Chang ................ | 165/80.4 |
| 2005/0052847 A1 | * | 3/2005 | Hamman .............. | 361/699 |
| 2005/0128700 A1 | * | 6/2005 | Alperin et al. ......... | 361/687 |

* cited by examiner

*Primary Examiner*—Boris Chervinsky
*Assistant Examiner*—Zachary Pape

(57) ABSTRACT

The described embodiments relate to devices and cooling systems for same. One exemplary device includes a housing and at least one fan unit configured to move air through the housing. The device also includes a fluid channel comprising an impeller for moving fluid contained in the fluid channel, wherein the impeller is configured to be driven, at least in part, by air moving through the housing.

5 Claims, 9 Drawing Sheets

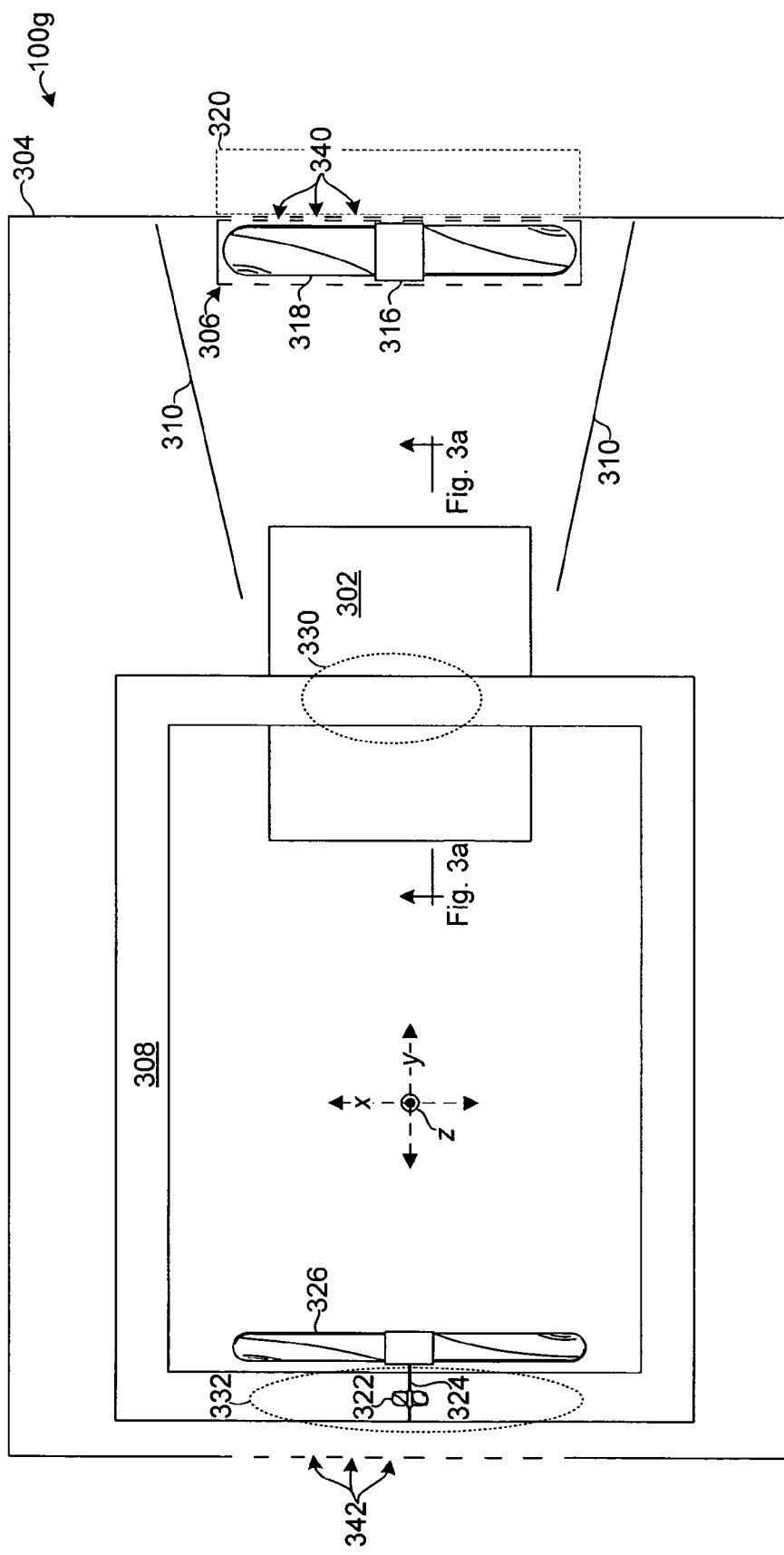
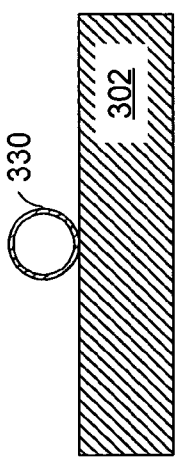
Fig. 3
Fig. 3A

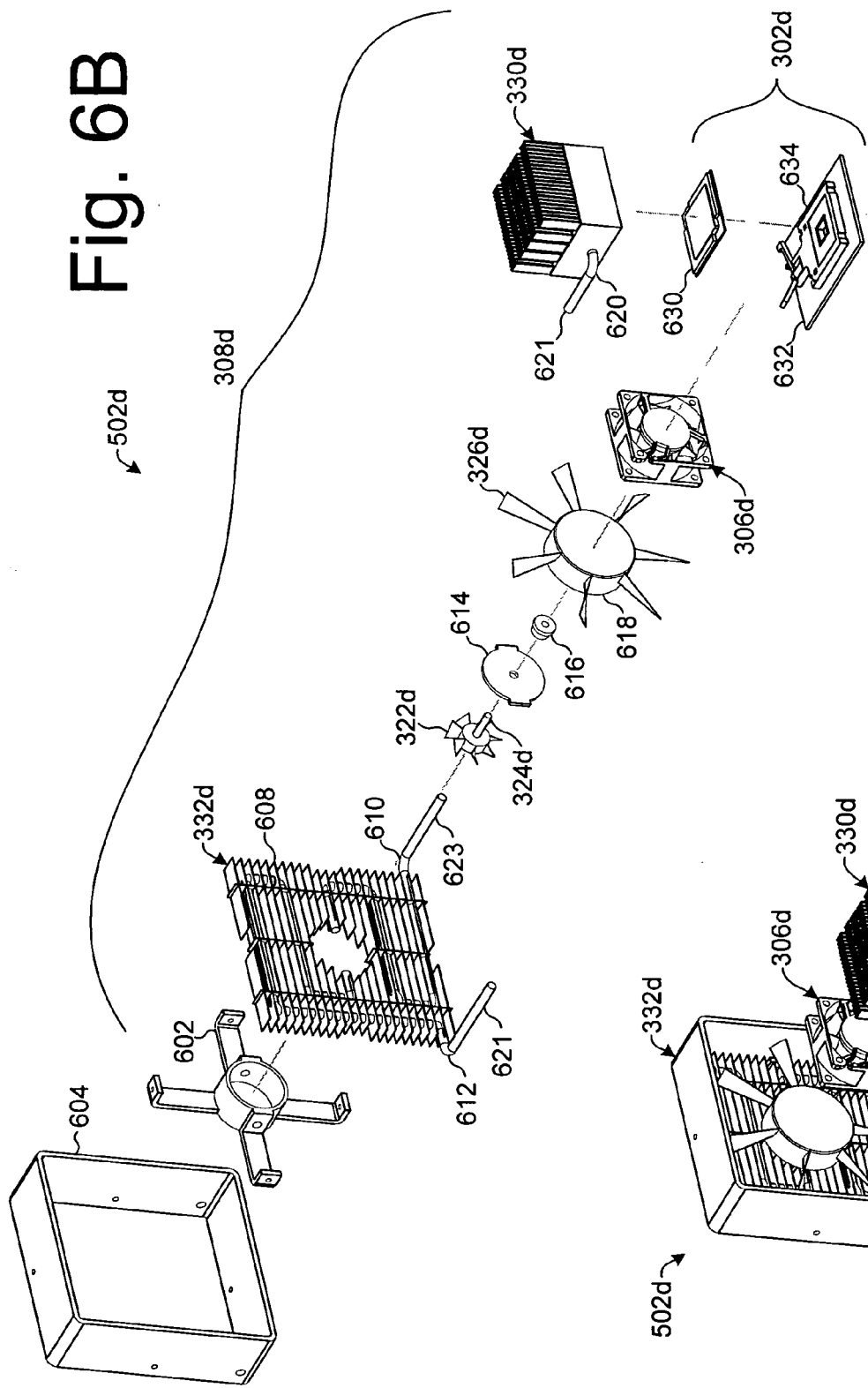

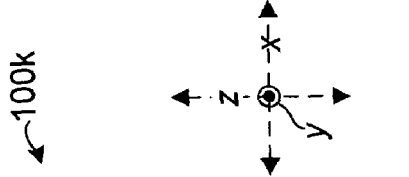
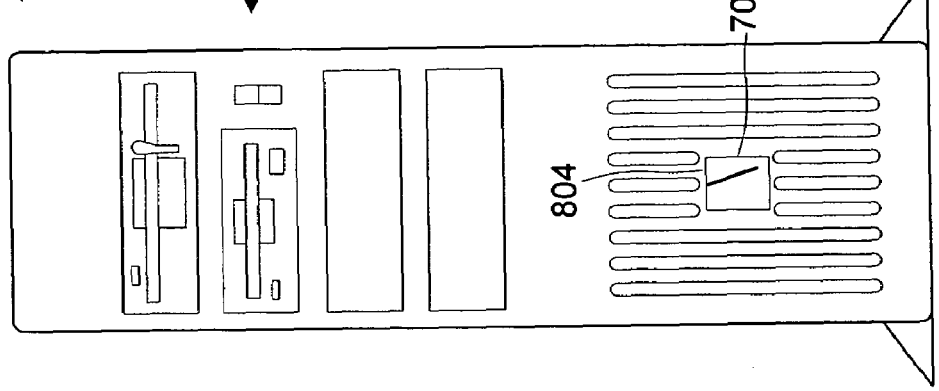
Fig. 8C
Fig. 8D
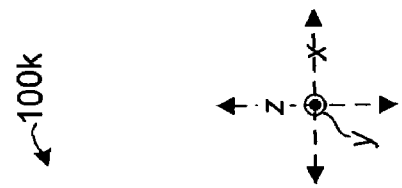
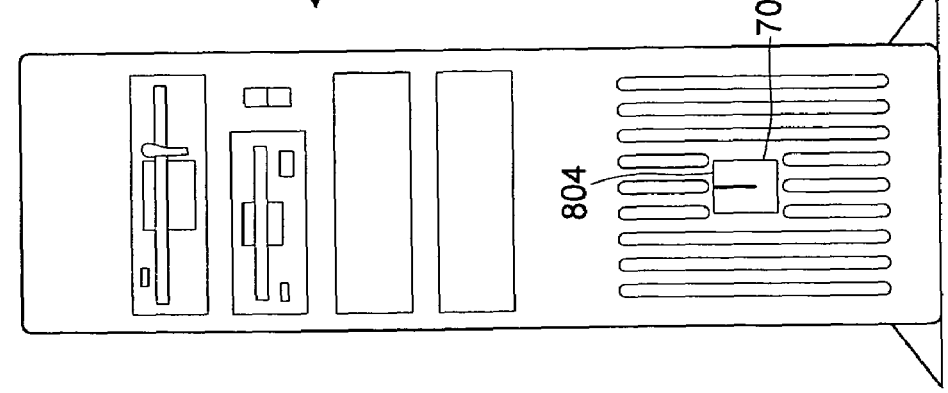
Fig. 8A
Fig. 8B

COOLING SYSTEMS AND METHODS FOR SAME

BACKGROUND

Cooling systems are employed in various devices including electronic devices. Examples of electronic devices can include personal computers, servers, televisions and home entertainment systems. Electronic devices employ various types of electrical components such as processors to achieve their intended functionality. Many electronic devices offer increased performance such as faster processing speed. With this increased performance often comes increased heat generation. Such developments, among other factors, can create a demand for cooling systems for use with electronic devices.

BRIEF DESCRIPTION OF THE DRAWINGS

The same numbers are used throughout the drawings to reference like features and components wherever feasible.

FIG. 3 illustrates a top view of a representation of an exemplary device in accordance with one embodiment of the inventive concepts.

FIG. 3A illustrates a cross-sectional view of a representation of a portion of the exemplary device illustrated in FIG. 3.

FIG. 6A illustrates a perspective view of a representation of an exemplary device cooling apparatus in accordance with one embodiment of the inventive concepts.

FIG. 6B illustrates an exploded perspective view of a representation of an exemplary device cooling apparatus in accordance with one embodiment of the inventive concepts.

FIGS. 8A and 8C illustrate front elevational views of a representation of an exemplary device in accordance with one embodiment of the inventive concepts.

FIGS. 8B and 8D illustrate front elevational views of a representation of a portion of the exemplary device illustrated in FIGS. 8A and 8C respectfully in accordance with one embodiment of the inventive concepts.

DETAILED DESCRIPTION

Overview

The following relates to cooling systems and methods of cooling. Among other uses these cooling systems can be employed in electronic devices. Electronic devices can comprise electrical components that can generate heat as a byproduct of their functionality. Fluid or liquid cooling systems can be provided to remove heat from the electrical components. Some of these fluid cooling systems may operate in conjunction with an air moving system such as a fan unit to cool an electronic device.

EXEMPLARY EMBODIMENTS

Figure 1A:
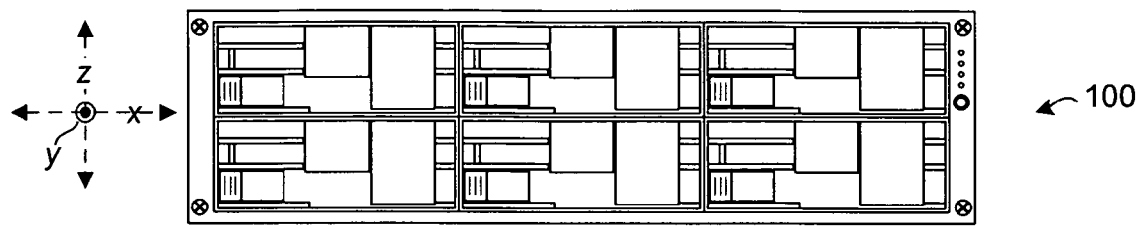
FIG. 1A illustrates a front elevational view of a representation of an exemplary electronic device in accordance with one embodiment of the inventive concepts.
Figure 1B:
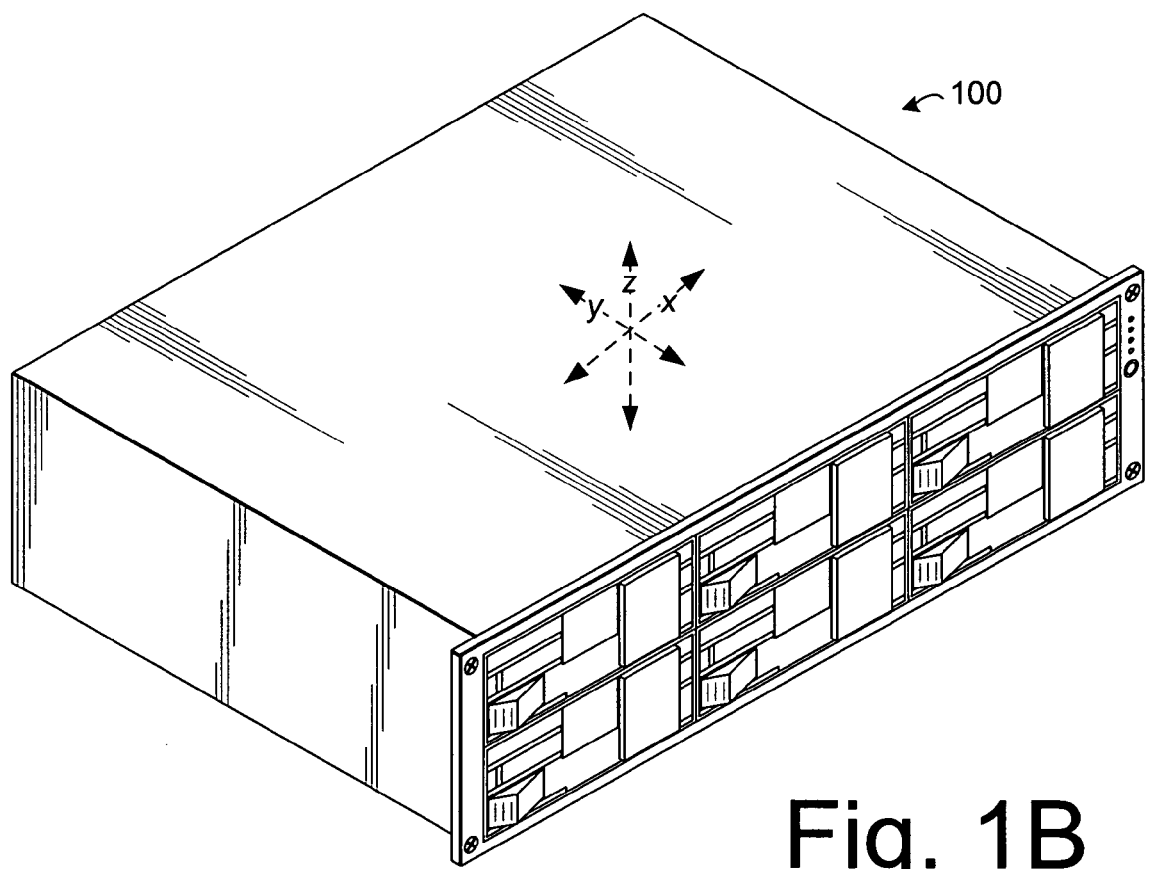
FIG. 1B illustrates a perspective view of a representation of an exemplary electronic device in accordance with one embodiment of the inventive concepts.

FIGS. 1A-1B illustrate front elevational and perspective views respectively of an exemplary electronic device 100. In this embodiment electronic device 100 can comprise a server. Other exemplary electronic devices can comprise personal computers (PCs), Apple computers, super computers, home entertainment devices such as digital versatile video (DVD) players/recorders, stereo amplifiers, and stereo receivers among others. Some electronic devices may be configured to be free standing while others can be configured to be utilized in association with other electronic devices. Still other electronic devices may be configured to be utilized either free standing and/or in association with other electronic devices. Reference axes x, y, and z are indicated in FIGS. 1A and 1B and will be maintained wherever practical in the remainder of the drawings.

Figure 2:
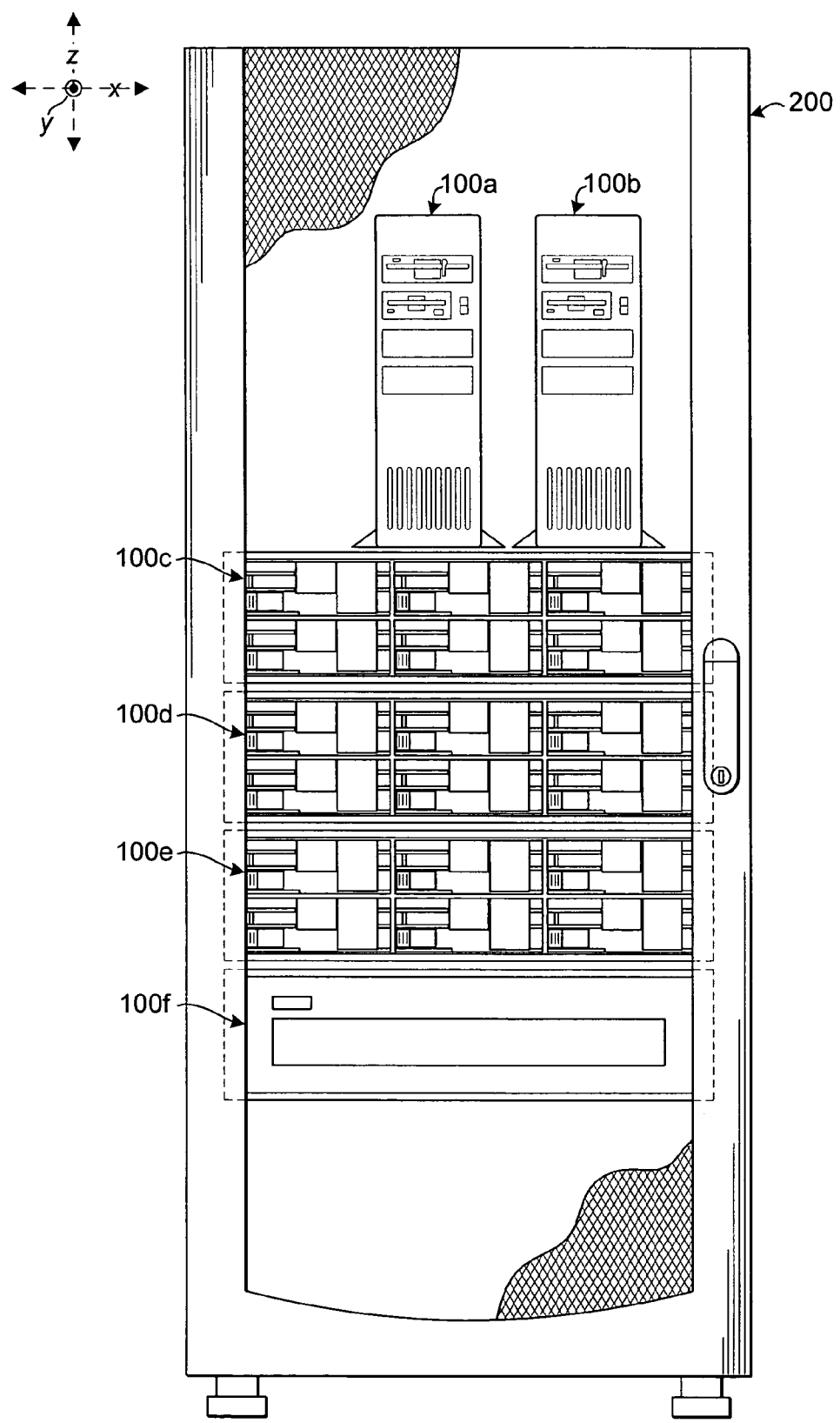
FIG. 2 illustrates a front elevation view of a representation of multiple electronic devices associated in a rack enclosure in accordance with one embodiment of the inventive concepts.

FIG. 2 illustrates multiple exemplary electronic devices 100a-f positioned in a rack or enclosure 200. In this embodiment electronic devices 100a-100b comprise personal computers (PCs) and electronic devices 100c-100f comprise servers. Electronic devices may be positioned in rack 200 to be associated operatively with one another and/or for other reasons. For example, electronic devices may be positioned in a rack for the security and/or organizational aspects provided by some racks. Association of electronic devices, such as in rack 200, may exacerbate heat issues associated with the electronic devices. For example, assembling multiple electronic devices within a rack may create a higher temperature ambient environment and/or reduce air movement. As such, associated electronic devices may have increased heat dissipation issues. Some exemplary racks may have air moving systems configured to move air through individual electronic devices positioned therein.

FIG. 3 illustrates a top cut-away view of another exemplary electronic device 100g. FIG. 3A illustrates a cross-sectional view of a portion of the exemplary electronic device illustrated in FIG. 3. In some embodiments electronic device 100g can comprise one or more electrical components 302 positioned in a housing 304. In some of these embodiments electronic device 100g also can comprise one or more fan units 306, one or more fluid channels 308 and a shroud or shrouds 310.

Examples of electrical components 302 can include, but are not limited to, processors, read only memory (ROM), random access memory (RAM), transformers, among others, and/or an assortment of such components. Housing 304, a portion of which is removed in this view, can have any suitable shape, such as a box shape. Housing 304 can also be made from any suitable material. A commonly used material comprises sheet metal. The skilled artisan should recognize other suitable shapes and/or materials.

This particular embodiment comprises a single fan unit 306 which is configured to cause air movement through the housing 304. Examples are provided below of electronic devices employing multiple fan units. Fan unit 306 can comprise a drive means which in this embodiment comprises electric motor 316 and one or more blades (blades) 318. In this particular embodiment fan unit 306 is positioned within the housing. Other embodiments can utilize an external fan or other air movement means. For example, fan unit 306 can be positioned in outlined region 320 illustrated in FIG. 3 outside of housing 304. In another example a rack (described above in relation to FIG. 2) may provide air movement through the electronic devices positioned therein to supplement or create air movement within the electronic devices.

Fluid channel 308 can be configured to remove heat or cool electrical component 302. Fluid channel 308 can comprise a circulation means for moving fluid contained in the fluid channel. In this embodiment the circulation means can comprise an impeller 322. Impeller 322 can, in some embodiments revolve around an axis generally defined by a shaft 324. The shaft can be driven via various mechanisms. In this particular embodiment shaft 324 is driven, at least in part, by air movement over one or more blades or vanes (vanes) 326 such that shaft 324 mechanically couples vanes 326 to impeller 322.

As is illustrated in FIGS. 3-3A, fluid channel 308 can generally comprise a first region, which in this embodiment comprises a heat absorbing region 330 and a second region, which in this embodiment comprises a heat dissipation region 332. The fluid channel can be configured to absorb heat energy from electrical components 302 at heat absorbing region 330 and to dissipate the heat energy at the heat dissipation region 332 which can be positioned such that the dissipated heat energy exits housing 304.

Fluid channel 308 can be constructed, based at least in part, on a desired rate of heat dissipation from electrical component 302. Factors that can affect the rate of heat dissipation can include, but are not limited to, an amount of contact area between heat absorbing region 330 and electrical component 302, a thermal conductivity of the material comprising heat absorbing region 330 and/or the heat dissipation region 332, a flow rate of liquid through fluid channel 308, and a molar heat capacity of the fluid contained in fluid channel 308.

Shroud 310 can be positioned within housing 304 to focus or concentrate air movement. In electronic device 100g shroud 310 is configured to concentrate air movement from a first air vent 340 toward electrical components 302 and a second air vent 342. In this embodiment the air also can move past vanes 326 and heat dissipation region 332. In this particular embodiment, air tends to move generally through the housing from a back of the electronic device 100g at first vent 340 to a front of the electronic device at second vent 342. This is but one suitable configuration. For example, other embodiments may move air from front to back, side to side or bottom to top among other configurations.

In the embodiment illustrated in FIG. 3, satisfactory cooling can be obtained by utilizing a commercially available polymer tubing to define fluid channel 308. In some such embodiments impeller 322 may be positioned in an impeller housing having inflow and outflow couplers to which the polymer tubing can be coupled to form the fluid channel 308. The fluid channel can be filled with a liquid such as de-ionized water, various alcohols, ethyl glycol, propyl glycol and/or a combination of these and other liquids. This is but one suitable configuration of suitable liquids. The skilled artisan should recognize other suitable liquids, some examples of which are described below.

Fluid channel 308 at its heat absorbing region 330 passes in proximity to electrical component 302. In this instance the heat absorbing region physically contacts the electrical component. In some embodiments, the construction of the fluid channel 308 is generally homogenous along its length. Other embodiments may utilize dissimilar materials to construct the fluid channel. In one such example heat absorbing and/or heat dissipating regions 330, 332 may be constructed of a first material selected for having a relatively high rate of thermal conductivity, among other factors. Examples of such materials include metals, among others. These regions may be connected by another material such as polymer tubing selected for its ease of handling and flexibility, among other factors, and which may have a relatively low rate of thermal conductivity. Such an example will be described in more detail below.

Figure 4:
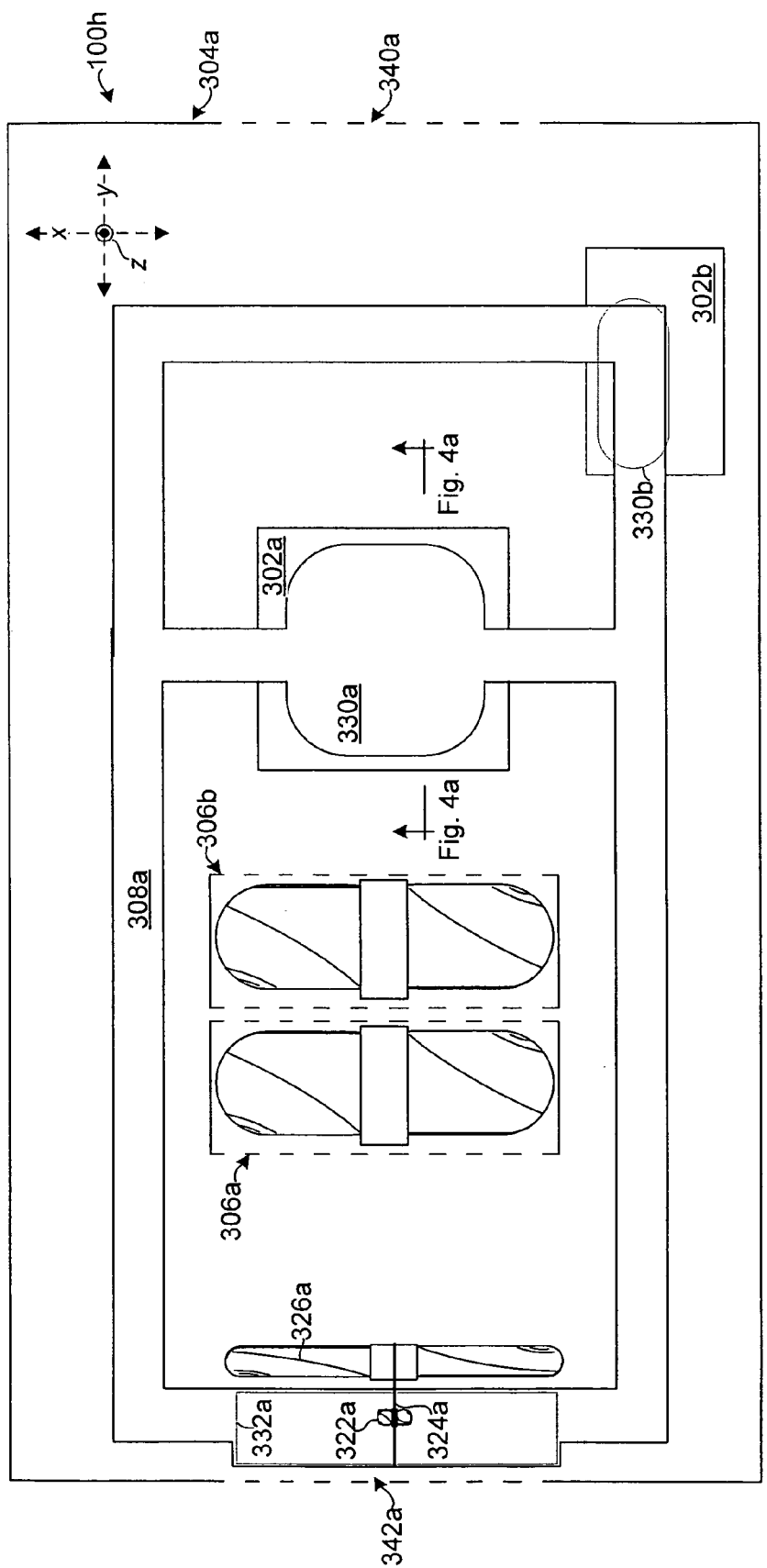
FIG. 4 illustrates a top view of a representation of an exemplary device in accordance with one embodiment of the inventive concepts.

FIG. 4 illustrates another exemplary electronic device 100h. This embodiment has a first electrical component 302a and a second electrical component 302b positioned within housing 304a. In this embodiment two fan units 306a, 306b are positioned in housing 304a and can be configured to create air movement generally into the housing through first air vent 340a and generally out of second air vent 342a. Fluid channel 308a can be configured with two heat absorbing regions 330a, 330b to absorb heat from electrical components 302a, 302b respectively. The heat can be dissipated at dissipation region 332a. Vane 326a can be configured to turn impeller 322a via shaft 324a to cause fluid movement within the fluid chamber. While impeller 322a is located in heat dissipation region 332a in this embodiment, such need not be the case. For example, in other embodiments, the impeller may be positioned in the heat absorbing region, among other locations, to create fluid movement.

Figure 4A:
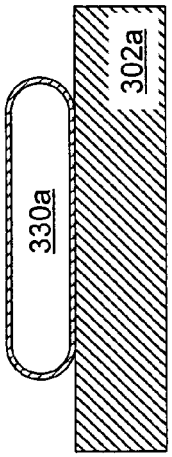
FIG. 4A illustrates a cross-sectional view of a representation of a portion of the exemplary device illustrated in FIG. 4.

Heat dissipation from an electrical component such as electrical component 302a into fluid channel 308a can be increased, among other techniques, by increasing the contact area between the electrical component and the fluid channel. FIG. 4A illustrates one such example, where a cross-sectional area of fluid channel 308 is increased and the shape changed to increase the contact area between electrical component 302a and the fluid channel's heat absorbing region 330a. The rate of heat dissipation can be increased alternatively or additionally by forming the heat absorbing region out of material such as aluminum or copper that has a relatively high thermal conductivity rather than a material such as a polymer which may have a relatively low thermal conductivity.

As can best be appreciated from FIG. 4A, this embodiment illustrates the cross-sectional shape of heat absorbing region 330a is enlarged relative to the other portions of fluid channel to increase the rate of heat dissipation from electrical component 302a. In this particular embodiment heat absorbing region 330a can be constructed from a metal such as copper or other materials with relatively high thermal conductivity rates.

Similarly, in some embodiments, heat dissipation region 332a can be constructed from a material with a relatively high thermal conductivity such as various metals. Further, heat dissipation can be accelerated by utilizing a radiator type configuration that increases the contact area with air moving past heat dissipation region 332a.

Figure 5:
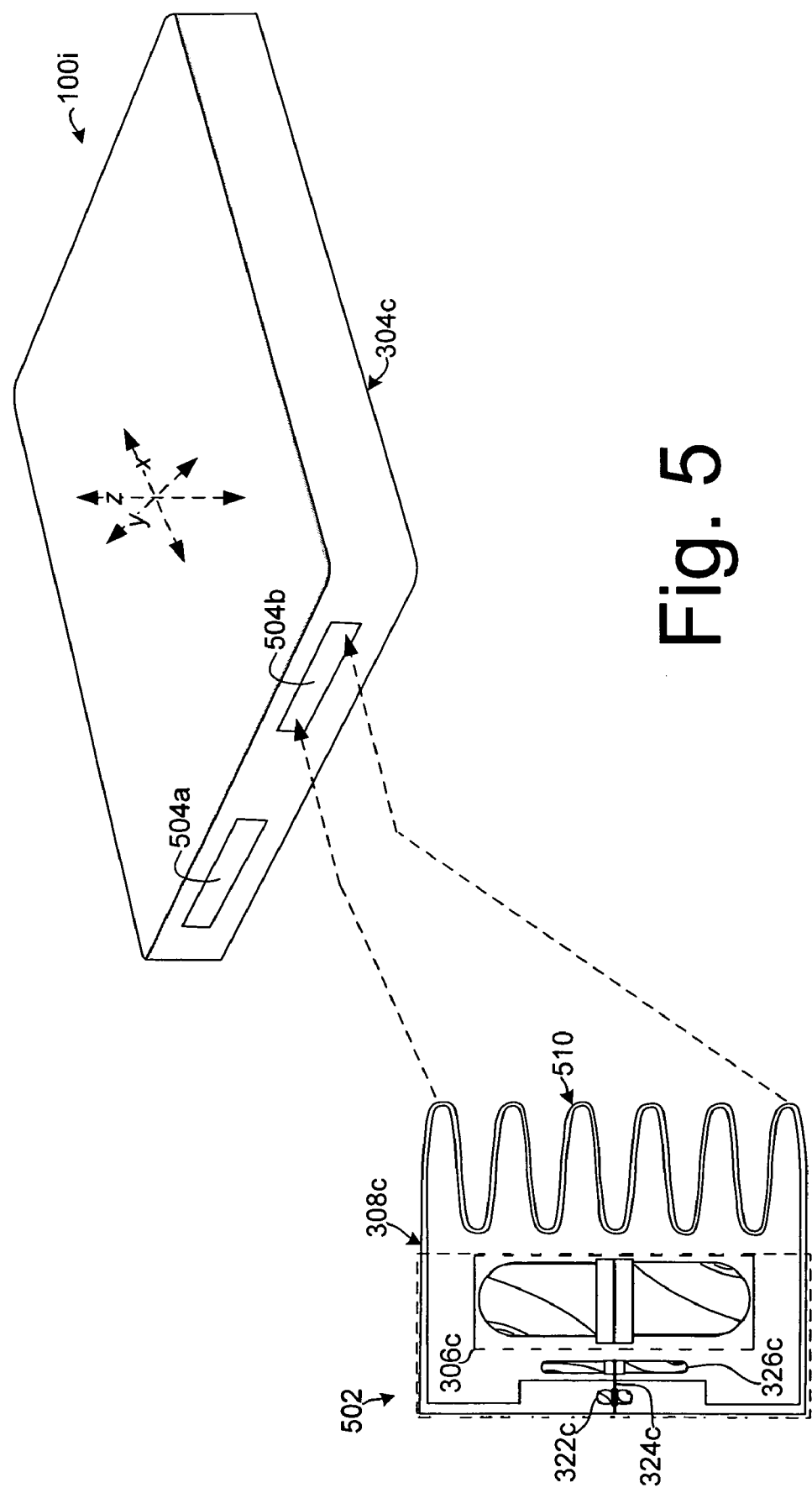
FIG. 5 illustrates a perspective view of a representation of an exemplary device in accordance with one embodiment of the inventive concepts.

FIG. 5 illustrates a further embodiment where fan assembly 306c and fluid channel 308c are associated as a cooling apparatus 502. In this particular instance fan assembly 306c and fluid channel 308c are associated as a modular cooling system which can be preassembled for use in various devices. One or more modular cooling apparatus 502 can be associated with an electronic device 100i to provide cooling of associated electrical components as described above.

As illustrated in FIG. 5, one or more modular cooling apparatus 502 can be inserted into slots or other openings 504a, 504b in housing 304c to provide a cooling system for the electronic device's electrical components and/or to augment an existing cooling system. Such a configuration allows design flexibility in that the number of modular cooling apparatus for a given electronic device can be selected based upon the desired cooling capacity as should be recognized by the skilled artisan. Openings, such as openings 504a, 504b can be on any surface or surfaces of housing 304c and can comprise more or less than the two illustrated here. Other modular cooling apparatus can be configured for use with a housing which does not have any suitable openings such as 504a, 504b. For example, modular units can be configured such that the housing is partially dissembled to insert the modular unit and then reassembled. The modular unit may comprise some type of positioning means, such as a magnet, to maintain the modular unit in a desired location within or in relation to the housing. For example, the magnet may allow the modular unit to be positioned and maintained proximate a vent within the housing. The skilled artisan should recognize other configurations.

In some embodiments, modular cooling apparatus 502 comprises one or more fan units 306c associated with fluid channel 308c. The fan unit can supply energy to circulate fluid within the fluid channel, such as by imparting force on vanes 326c and impeller 322c via shaft 324c.

In some embodiments, at least a portion of the modular cooling apparatus's fluid channel 308c comprises a flexible tubing or other material that can be manipulated into various configurations. For example, as illustrated in FIG. 5, fluid channel 308c comprises polymer tubing of which a portion is arranged in a generally serpentine configuration indicated generally at 510. This configuration can provide ease of handling of the cooling system. When positioning the modular cooling apparatus 502 with the electronic device 100i the portion 510 can be manipulated into essentially limitless configurations to allow the tubing to pass in proximity to various electrical components positioned in the housing. Thus a generic modular cooling apparatus 502 can be configured to various different applications. Other modular cooling apparatus may have a more fixed design, as should be recognized by the skilled artisan.

In some embodiments fluid channel 308c further can comprise a sensor means for indicating flow or movement of the fluid within the cooling channel. Some suitable sensor means directly indicate fluid flow while other sensor means indirectly indicate fluid flow. In one such example which indirectly senses fluid flow, magnetic tips can be utilized on impeller 322c. As should be recognized by the skilled artisan, flux leakage can be detected by a control loop to indicate impeller movement and/or revolutions per minute. In such an example, movement of the impeller can indirectly indicate fluid movement. Examples of sensor means which directly indicate fluid flow are provided below in relation to FIGS. 7 and 8A-8D.

FIGS. 6A-6B illustrate another exemplary cooling apparatus 502d. FIG. 6A illustrates a perspective view, while FIG. 6B illustrates an exploded perspective view of apparatus 502d.

In this embodiment, fan unit or fan assembly 306d is interposed between heat absorbing region 330d and the heat dissipation region 332d. Other configurations are described above. Fluid channel 308d comprises a pump housing 602 secured to a pump enclosure 604. The fluid channel further comprises heat dissipation region 332d in the form of a radiator 608 having an inlet 610 and an outlet 612 and being configured to be positioned in pump enclosure 604.

The fluid channel 308d also can have a pump housing cover 614 configured to fluidly seal pump housing 602. Fluid channel 308d further comprises an impeller bushing 616 configured to seal shaft 324d as the shaft exits pump housing cover 614. Impeller 322d is coupled to shaft 324d which is coupled to vanes 326d via a body 618. The impeller can have blades having a fixed or variable pitch. Further, the blade pitch and/or number of blades can be selected to control the rate fluid is moved through the fluid channel in a given embodiment.

Heat absorbing region 330d can comprise a heat absorbing region inlet 620 configured to be fluidly coupled to radiator outlet 612 by a hose 621. Heat absorbing region 330d further comprises an outlet 622, illustrated in FIG. 6C, configured to be coupled fluidly to radiator inlet 610 via a hose 623. In some embodiments the hoses can be attached permanently to the heat dissipation and/or heat absorbing regions, while in other embodiments the hoses can be removably coupled with the associated inlets and outlets. Hoses 621, 623 which are coupled removably to the heat absorbing region and the heat dissipation region can be utilized where the apparatus is configured to replace individual heat dissipation regions and/or heat absorbing regions upon a component failure thereof.

Electronic device cooling apparatus 502d can further comprise electrical component 302d in the form of a processor 630 coupled to a printed circuit board 632 via connector 634. As described above this is but one example of electronic devices which can be cooled with an exemplary cooling apparatus.

Figure 6C:
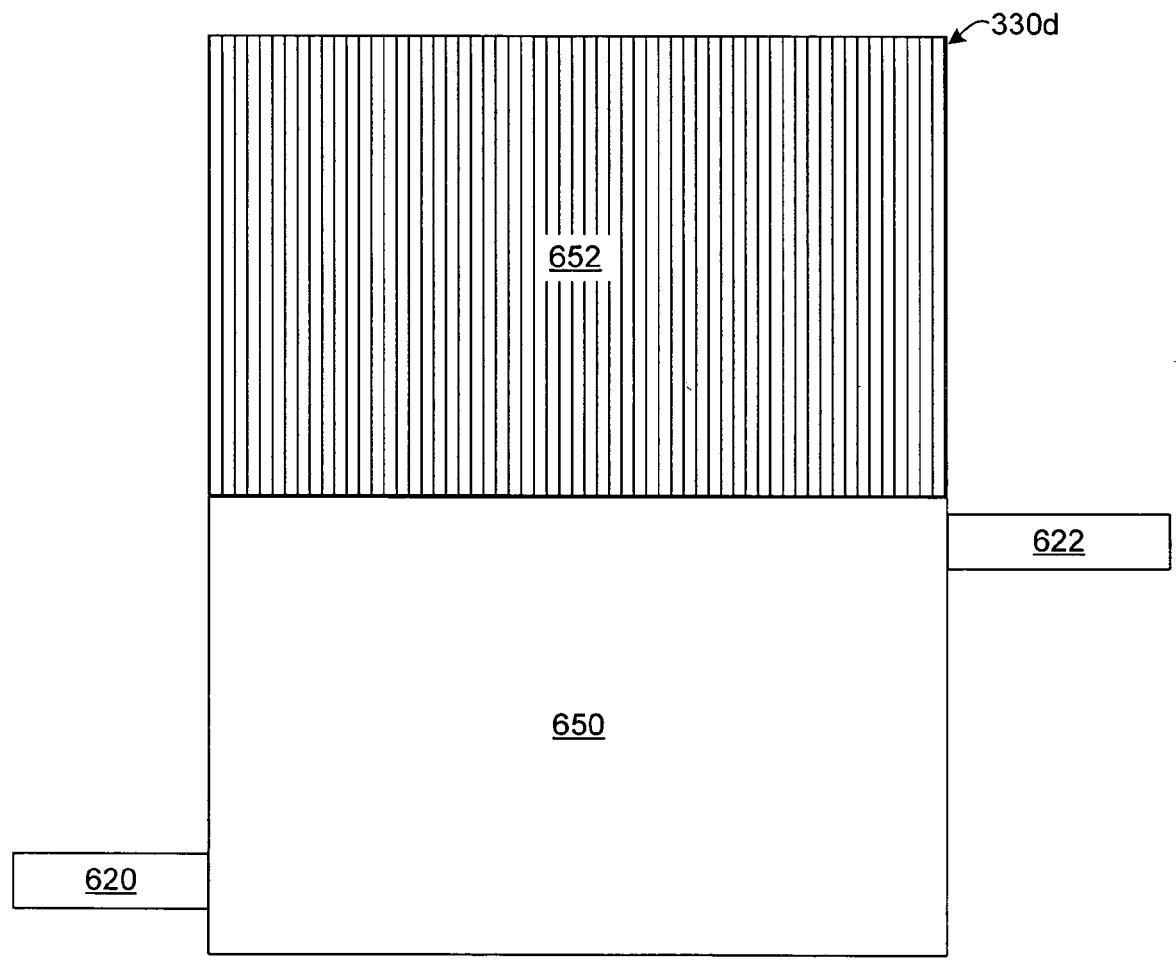
FIG. 6C illustrates a front elevational view of a representation of portion of an exemplary device cooling apparatus in accordance with one embodiment of the inventive concepts.

FIG. 6C illustrates a front elevational view of heat absorbing region 330d which has an internal volume 650 and multiple vanes 652. The heat absorbing region can be formed from any suitable material. In this particular embodiment, the heat absorbing region is comprised of machined aluminum. This is but one suitable configuration. Inlet 620 supplies coolant to internal volume 650 while outlet 622 removes coolant from the internal volume. In this particular configuration, the inlet and outlet are vertically arranged so that as the coolant captures heat energy within the internal volume it can vertically stratify due in part to diminished density and be removed via the outlet hose. This is but one suitable configuration, the skilled artisan should recognize other suitable heat absorbing region configurations.

Figure 7:
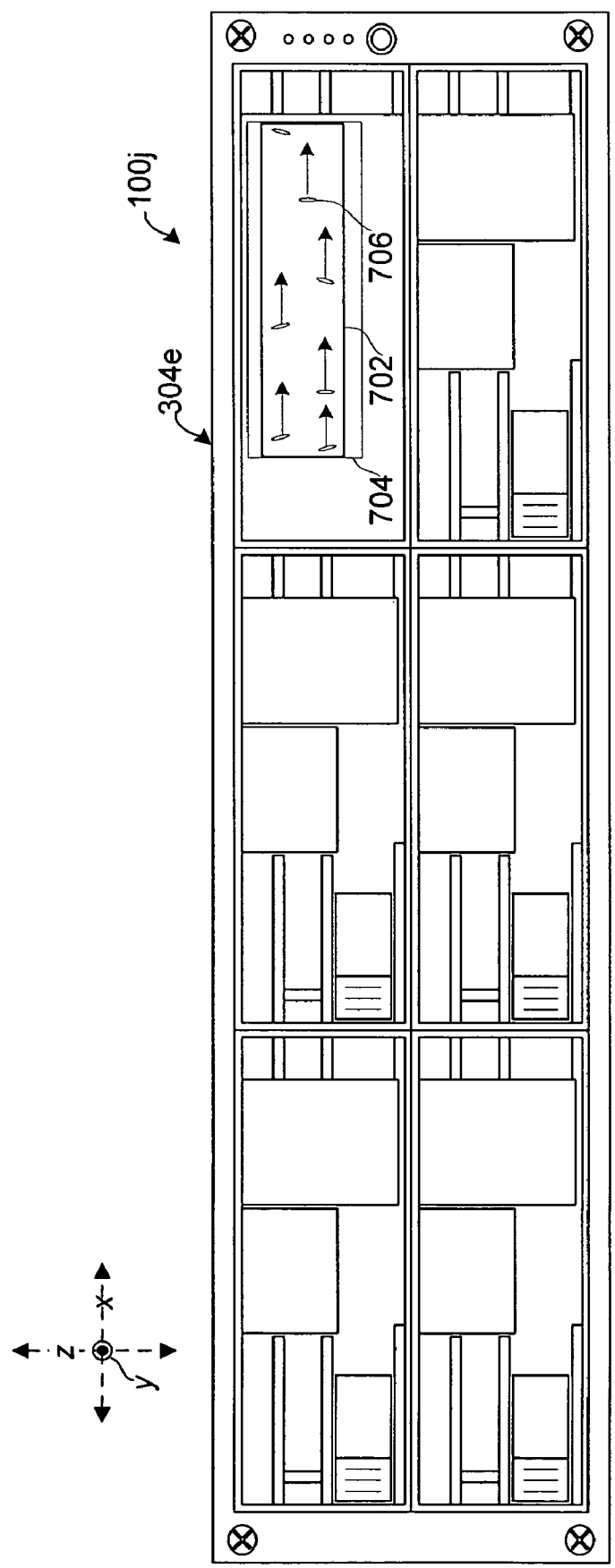
FIG. 7 illustrates a front elevational view of a representation of an exemplary device in accordance with one embodiment of the inventive concepts.

FIGS. 7 and 8A-8D illustrate examples of sensor means for indicating flow or movement of the liquid within an exemplary fluid channel. FIGS. 7, 8A, and 8C represent front elevational views of exemplary electronic devices. FIGS. 8B and 8D illustrate enlarged portions of FIGS. 8A and 8C respectively.

FIG. 7 illustrates an embodiment where the sensor means comprises a clear observer portion 702 of the fluid channel through which an observer can see the fluid contained within the fluid channel. The fluid channel may be constructed from a clear material and/or a 'window' may be added to provide the observer portion 702. In some embodiments, observer portion 702 may be positioned so that it is visible from outside housing 304e of electronic device 100j. For example, as illustrated in FIG. 7, a portion 704 of housing 304e can be removed corresponding to the location of the observer portion for ease of observation. In some embodiments material which may aid the observer in detecting movement may be added to the liquid. In the embodiment illustrated in FIG. 7, Mylar flakes 706 can be added to the cooling liquid. The Mylar flakes can be carried along with the fluid and can make fluid movement easier to detect for a viewer. Other embodiments may suspend other materials in the liquid to aid the observer. Various suitable embodiments should be recognized by the skilled artisan.

FIGS. 8A-8D illustrate another sensor means for indicating flow or movement of the liquid within an exemplary fluid channel of electronic device 100k. In this particular embodiment a pendulum 804 is suspended in observer portion 702a. As can best be appreciated from FIGS. 8A-8B, when the liquid is stationary pendulum 804 can hang relatively parallel to the pull of gravity generally indicated here as the z-axis.

As can best be appreciated from FIGS. 8C-8D, fluid flow within fluid channel can cause angular deflection α of pendulum 804 from the z-axis. Increased angular deflection can indicate an increased rate of fluid flow. The skilled artisan should recognize other exemplary embodiments.

CONCLUSION

Devices and cooling systems and methods are described above. Some of the embodiments can be configured to cool electrical components positioned in a housing of an electronic device. These embodiments can comprise a fan unit configured to move air through the housing, and a fluid channel containing an impeller for moving fluid contained in the fluid channel. In some of these embodiments the impeller is driven, at least in part, by air moving through the housing, thereby reducing the complexity of the electronic device.

Although the inventive concepts have been described in language specific to structural features and/or methodological steps, it is to be understood that the inventive concepts in the appended claims are not limited to the specific features or steps described. Rather, the specific features and steps are disclosed as forms of implementing the inventive concepts.

The invention claimed is:

1. An apparatus comprising:
    at least one fan assembly comprising an electric motor and at least one fan blade, the fan assembly being configured to move air through a housing of an electronic device;
    at least one fluid channel associated with the fan assembly such that air movement from the fan assembly causes fluid movement within the fluid channel via a circulation means;
    a pump housing that defines at least a portion of the fluid channel and that contains the circulation means;
    a body having a plurality of blades positioned thereupon; and,
    a shaft extending between first and second ends effective that the circulation means is secured to the first end and the body is secured to the second end, and wherein the body surrounds a portion of the pump housing.

2. The apparatus as recited in claim 1, wherein the at least one fan assembly and the at least one fluid channel comprise a modular unit.

3. The apparatus as recited in claim 1, wherein the fluid channel comprises at least a first region configured to absorb heat energy and at least a second region configured to dissipate heat energy.

4. The apparatus as recited in claim 3, wherein the first region and the second region comprise a material having a rate of thermal conductivity and further comprising one or more hoses coupling the first and second regions together, wherein the one or more hoses having a rate of thermal conductivity that is lower than the rate of thermal conductivity of said material.

5. The apparatus as recited in claim 1, wherein the motor rotates around a first axis and the shaft rotates around a second axis that is parallel to the first axis.

* * * * *